United States Patent
Ohno et al.

(10) Patent No.: US 11,622,446 B2
(45) Date of Patent: Apr. 4, 2023

(54) WIRING SUBSTRATE

(71) Applicant: IBIDEN CO., LTD., Gifu (JP)

(72) Inventors: Isao Ohno, Ogaki (JP); Tomoya Daizo, Ogaki (JP); Yoji Sawada, Ogaki (JP); Kazuhiko Kuranobu, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 17/359,805

(22) Filed: Jun. 28, 2021

(65) Prior Publication Data

US 2022/0015234 A1    Jan. 13, 2022

(30) Foreign Application Priority Data

Jul. 9, 2020  (JP) .............................. JP2020-118810

(51) Int. Cl.
| | |
|---|---|
| *H05K 1/11* | (2006.01) |
| *H05K 1/09* | (2006.01) |
| *H01L 23/00* | (2006.01) |
| *H01L 23/498* | (2006.01) |

(52) U.S. Cl.
CPC ........ *H05K 1/115* (2013.01); *H01L 23/49827* (2013.01); *H01L 24/14* (2013.01); *H05K 1/09* (2013.01); *H01L 2225/1058* (2013.01)

(58) Field of Classification Search
CPC .......... H05K 1/111; H05K 1/115; H05K 1/09; H05K 2201/0367; H05K 2201/0939; H05K 2203/0415; H01L 2224/05554; H01L 2224/13013; H01L 23/49827; H01L 23/49822; H01L 23/49894; H01L 23/49811; H01L 24/14; H01L 2225/1058; H01R 12/585
See application file for complete search history.

(56) References Cited

U.S. PATENT DOCUMENTS

| | | | |
|---|---|---|---|
| 2015/0077963 A1* | 3/2015 | Adachi | H05K 3/4015 29/830 |
| 2015/0313015 A1* | 10/2015 | Wada | H05K 1/113 174/261 |
| 2016/0242285 A1* | 8/2016 | Katsuno | H05K 3/244 |
| 2016/0316558 A1* | 10/2016 | Sakai | H01L 23/12 |

FOREIGN PATENT DOCUMENTS

JP    2016-018806 A    2/2016

\* cited by examiner

*Primary Examiner* — Roshn K Varghese
(74) *Attorney, Agent, or Firm* — Oblon, McClelland, Maier & Neustadt, L.L.P.

(57) ABSTRACT

A wiring substrate includes a resin insulating layer, a conductor pad formed on the resin insulating layer, a coating insulating layer formed on the resin insulating layer such that the coating insulating layer is covering the conductor pad, and a metal post connected to the conductor pad and protruding from the coating insulating layer such that a gap is formed between the metal post and the conductor pad at a peripheral edge of the metal post. The coating insulating layer is formed such that the coating insulating layer has an interposed portion formed in the gap between the metal post and the conductor pad at the peripheral edge of the metal post.

20 Claims, 4 Drawing Sheets

WIRING SUBSTRATE

CROSS-REFERENCE TO RELATED APPLICATIONS

The present application is based upon and claims the benefit of priority to Japanese Patent Application No. 2020-118810, filed Jul. 9, 2020, the entire contents of which are incorporated herein by reference.

BACKGROUND OF THE INVENTION

Field of the Invention

The present invention relates to a wiring substrate.

Description of Background Art

Japanese Patent Application Laid-Open Publication No. 2016-18806 describes a wiring substrate having a metal post formed on a wiring layer. The metal post protrudes from an upper surface of a solder resist layer that covers the wiring layer. An entire surface of the metal post on a base end side is connected to the wiring layer. The entire contents of this publication are incorporated herein by reference.

SUMMARY OF THE INVENTION

According to one aspect of the present invention, a wiring substrate includes a resin insulating layer, a conductor pad formed on the resin insulating layer, a coating insulating layer formed on the resin insulating layer such that the coating insulating layer is covering the conductor pad, and a metal post connected to the conductor pad and protruding from the coating insulating layer such that a gap is formed between the metal post and the conductor pad at a peripheral edge of the metal post. The coating insulating layer is formed such that the coating insulating layer has an interposed portion formed in the gap between the metal post and the conductor pad at the peripheral edge of the metal post.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
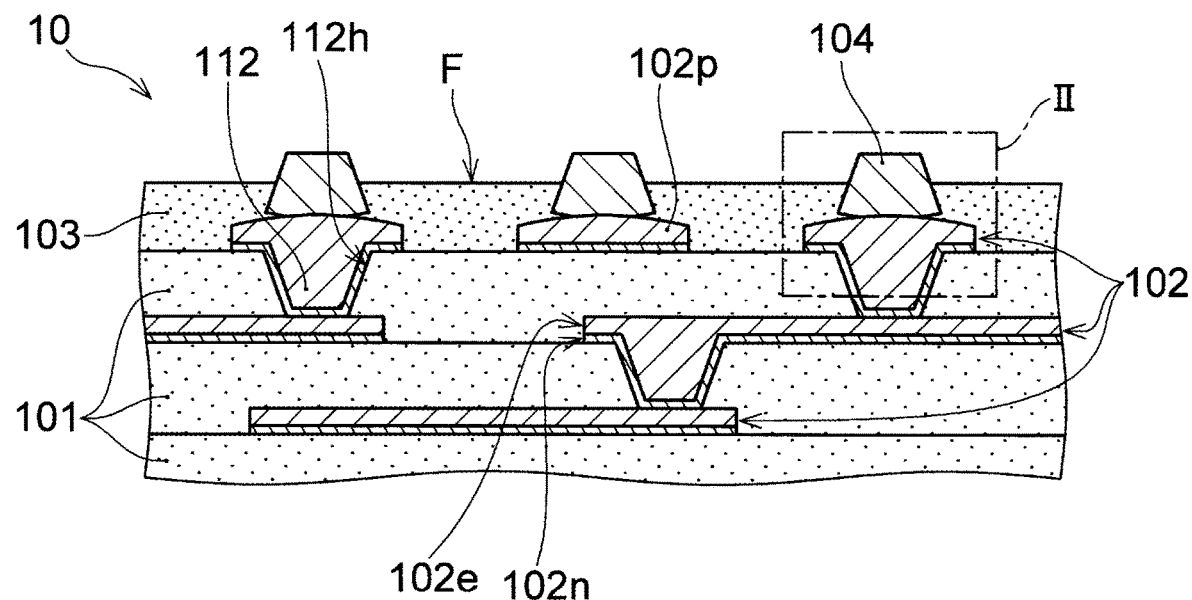
FIG. 1 is a cross-sectional view partially illustrating an example of a wiring substrate according to an embodiment of the present invention.

Embodiments will now be described with reference to the accompanying drawings, wherein like reference numerals designate corresponding or identical elements throughout the various drawings.

A wiring substrate according to an embodiment of the present invention is described with reference to the drawings. The drawings to be referred to below are drawn with features of the present invention emphasized for ease of understanding, without intending to show exact ratios of dimensions of structural elements. FIG. 1 partially illustrates a cross section of a wiring substrate 10, which is an example of the wiring substrate of the present embodiment. The wiring substrate 10 is formed of insulating layers and conductor layers, which are alternately laminated, and, among the insulating layers and conductor layers, resin insulating layers 101, a coating insulating layer 103 and conductor layers 102 are illustrated in FIG. 1. A surface (F) on one side of the wiring substrate 10 illustrated in FIG. 1 is formed as a component mounting surface on which an external electronic component such as a semiconductor element is mounted. The component mounting surface (F) of the wiring substrate 10 illustrated in FIG. 1 is formed of surfaces of the coating insulating layer 103 and metal posts 104 protruding from the coating insulating layer 103.

In the description of the wiring substrate 10 of the present embodiment, of each element of the wiring substrate 10, a component mounting surface (F) side, that is, an upper side on a drawing sheet is referred to as an "upper side" or simply "upper," and an opposite side thereof is referred to as a "lower side" or simply "lower." Therefore, an end part on the upper side of each element is also referred to as an "upper end" thereof, and an end part of the lower side of each element is also referred to as a "lower end" thereof.

In FIG. 1, among the multiple resin insulating layers 101 and the multiple conductor layers 102 of the wiring substrate 10, three resin insulating layers 101 and three conductor layers 102 on the component mounting surface (F) side are illustrated. The wiring substrate of the embodiment includes one or more resin insulating layers 101, and one or more conductor layers 102, and the number of the resin insulating layers 101 and the number of the conductor layers 102 of the wiring substrate 10 are not particularly limited and can be increased or decreased as appropriate. By including more conductor layers in the wiring substrate 10, a larger and more complicated electrical circuit can be formed in the wiring substrate 10 without increasing a planar size of the wiring substrate 10.

The conductor layers 102 are in contact with the resin insulating layers 101 and can have any conductor patterns. Each conductor layer 102 is electrically connected via via conductors 112, which are formed penetrating a resin insulating layer 101, to a conductor layer 102 on an opposite side of the resin insulating layer 101. In the example illustrated in FIG. 1, each of the via conductors 112 has a tapered shape that is reduced in diameter toward an opposite side from the component mounting surface (F). However, the shape of each of the via conductors 112 is not limited to this. It is also possible that each of the via conductors 112 has a shape that is reduced in diameter toward the component mounting surface (F), or is formed in a cylindrical shape that has the same diameter in a thickness direction of the resin insulating layers 101 and is substantially orthogonal to the conductor layers 102. For convenience, the term "reduced in diameter" is used. However, an opening shape of each of the via conductors 112 is not necessarily limited to a circular shape. The term "reduced in diameter" simply means that a longest distance between two points on an outer circumference of a horizontal cross section of each of the via conductors 112 is reduced.

Among the three conductor layers 102 illustrated in FIG. 1, the conductor layer 102 formed closest to the component mounting surface (F) includes conductor pads (102p). The conductor pads (102p) are electrically connected via the metal posts 104 formed thereon to connection pads of an external electronic component such as a semiconductor element. The metal posts 104 protrude to the component mounting surface (F) side from the coating insulating layer 103, which is formed so as to cover surfaces of the conductor pads (102p) and the resin insulating layer 101.

The metal posts 104 of the wiring substrate 10 in the example illustrated in FIG. 1 are reduced in diameter from a lower end (base end) side connected to the conductor pads (102p) toward an upper end side (the component mounting surface (F) side) on an opposite side. When the metal posts 104 are reduced in diameter from the base end side toward the upper end side, excessive proximity between the upper ends of adjacent metal posts 104 can be suppressed while a connection area with the conductor pads (102p) on the base end side is satisfactorily ensured. Occurrence of a defect such as a short circuit between the multiple metal posts 104 may be suppressed. However, the shape of the metal posts 104 is not limited to this. It is also possible that the metal posts 104 are formed to have substantially the same diameter from the base end side toward the upper end side. Similar to the via conductors 112, a horizontal cross-sectional shape of each of the metal posts 104 is not limited to a circular shape.

The resin insulating layers 101 of the wiring substrate 10 are each formed using any insulating resin such as an epoxy resin. A polyimide resin, a BT resin (bismaleimide-triazine resin), a polyphenylene ether resin, a phenol resin or the like can also be used. The resin insulating layers 101 may each contain inorganic filler such as silica. In the wiring substrate 10 in the example illustrated in FIG. 1, the resin insulating layers 101 do not each contain a core material. However, when necessary, the resin insulating layers 101 may each contain a core material such as a glass fiber or an aramid fiber. By containing a core material, the wiring substrate 10 can be improved in strength. The multiple resin insulating layers 101 may be respectively formed of different materials, or may all be formed of the same material.

The conductor layers 102 can each be formed using any material having suitable conductivity such as copper or nickel. The conductor layers 102 are each formed of, for example, a metal film layer (preferably an electroless copper plating film layer) or an electrolytic plating film layer (preferably an electrolytic copper plating film layer), or a combination thereof. In the example illustrated in FIG. 1, the conductor layers 102 are each formed to have a two-layer structure including a metal film layer (102n) and an electrolytic plating film layer (102e). However, the structure of each of the conductor layers 102 forming the wiring substrate 10 is not limited to the multilayer structure illustrated in FIG. 1. For example, the conductor layers 102 may be each formed to have a three-layer structure including a metal foil layer, a metal film layer, and an electrolytic plating film layer.

As illustrated in FIG. 1, the via conductors 112 can be integrally formed with the metal film layer (102n) and the electrolytic plating film layer (102e), which form the conductor layers 102. In the example illustrated in FIG. 1, the via conductors 112 are so-called filled vias filling conduction holes (112h), and are formed of a metal film layer and an electrolytic plating film layer, which cover bottom surfaces and side surfaces in the conduction holes (112h).

The coating insulating layer 103 can be formed using any insulating resin material. The coating insulating layer 103 is formed using, for example, a photosensitive polyimide resin or epoxy resin. The coating insulating layer 103 covers portions of the conductor pads (102p) and portions of side surfaces of the metal posts 104 formed on the conductor pads (102p), and covers a surface of the resin insulating layer 101 exposed between the multiple conductor pads (102p). The coating insulating layer 103 can be a solder resist layer.

The metal posts 104 are formed, for example, using copper or nickel. As will be described in detail later, the metal posts 104 can be formed by performing electrolytic plating of any metal material on the conductor pads (102p). When the metal posts 104 contains the same metal material as the metal contained in the conductor pads (102p), connectivity between the conductor pads (102p) and the metal posts 104 may be improved. A protective layer (not illustrated in the drawings) may be formed on upper ends of the metal posts 104. For example, a protective layer formed of Ni/Sn, Ni/Pd/Au, or the like is provided. A protective layer may be formed of Ni/Au or Sn. An OSP film may be formed.

Figure 2:
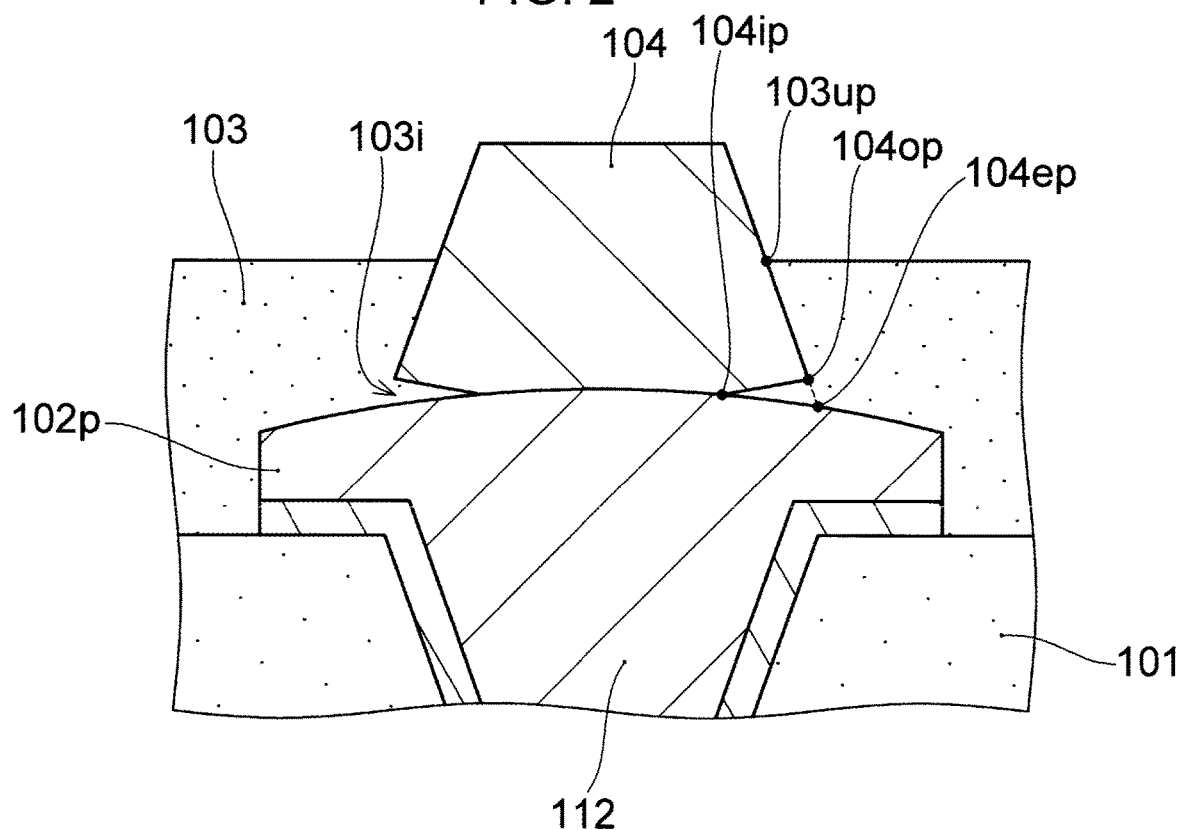
FIG. 2 is a partially enlarged cross-sectional view of the wiring substrate of FIG. 1.

FIG. 2 illustrates an enlarged view of a portion (II) surrounded by a one-dot chain line in FIG. 1. As illustrated in FIG. 2, a metal post 104 of the wiring substrate 10 is separated from a conductor pad (102p) by a wedge-shaped coating insulating layer 103 at a peripheral edge of a portion on the base end side that connects to the conductor pad (102p). That is, at a peripheral edge of a portion where the metal post 104 and the conductor pad (102p) connect to each other, a coating insulating layer 103 is interposed in a gap between the metal post 104 and the conductor pad (102p). This wedge-shaped portion of the coating insulating layer 103 that enters between the metal post 104 and the conductor pad (102p) is referred to as an interposed part (103i).

In FIG. 2, the interposed part (103i) is a region formed by connecting a point (104op), a point (104ip), and a point (104ep). The point (104op) is a base end side corner of the side surface of the metal post 104. The point (104ep) is an intersection point of an extension line along the side surface of the metal post 104 and the surface of the conductor pad (102p). The point (104ip) is a front end of the wedge-shaped portion that enters between the metal post 104 and the conductor pad (102p), and corresponds to the peripheral edge of the portion where the metal post 104 and the conductor pad (102p) connect to each other. The interposed part (103i) has a shape that tapers, that is, a shape that is reduced in width, from the side surface side (points (104op, 104ep) side) of the metal post 104 toward a center side (point (104ip) side). A length of a line connecting the point (104op), which is the base end side corner of the metal post 104, and the point (104ep) is shorter than a length of a line connecting a contact point (103up) of an upper surface of the coating insulating layer 103 with the metal post 104 and the point (104*op*). Specifically, the length of the line connecting the point (104*op*) and the point (104*ep*) is 0.2 or less times the length of the line connecting the point (103*up*) and the point (104*op*). In other words, the interposed part (103*i*) has a thickness of 0.2 or less times a thickness of a portion of the metal post 104 covered by the coating insulating layer 103.

The interposed part (103*i*) can effectively disperse a stress applied between the metal post 104 and the conductor pad (102*p*). Occurrence of a defect such as peeling or a crack near the portion where the metal post 104 and the conductor pad (102*p*) connect to each other can be effectively suppressed. Further, due to the interposed part (103*i*), an adhesion region between the coating insulating layer 103 and the metal post 104 and an adhesion region between the coating insulating layer 103 and the conductor pad (102*p*) are increased. Therefore, adhesion between the coating insulating layer 103 and the metal post 104, and adhesion between the coating insulating layer 103 and the conductor pad (102*p*) are improved. Occurrence of peeling can be suppressed. In particular, as illustrated in FIG. 2, when the metal post 104 has a shape that is reduced in diameter from the conductor pad (102*p*) side toward an opposite side, a region where the conductor pad (102*p*) and the coating insulating layer 103 are in close contact with each other may be relatively small. Even in this case, due to the presence of the interposed part (103*i*), desired adhesion between the conductor pad (102*p*) and the coating insulating layer 103 can be provided.

In the example illustrated in FIG. 2, a surface of the conductor pad (102*p*) on a side (upper side) connecting to the metal post 104 bulges toward the metal post 104. That is, the upper surface of the conductor pad (102*p*) is curved so as to be convex toward the metal post 104 side. When the surface of the conductor pad (102*p*) connecting to the metal post 104 is curved, a large connection area can be ensured, and connection reliability between the conductor pad (102*p*) and the metal post 104 can be improved. Further, also from a point of view of stress relaxation at the portion where the conductor pad (102*p*) and the metal post 104 connect to each other, it is preferable that the conductor pad (102*p*) bulges and a large connection area is ensured between the conductor pad (102*p*) and the metal post 104. From a point of view of improving the connection reliability, it is preferable that an apex of a bulging portion of the conductor pad (102*p*) (a point farthest from the resin insulating layer 101) is connected to the metal post 104, and it is more preferable that the apex is positioned near the center of the connection surface. The stress can be more effectively relaxed and the connection reliability between conductor pad (102*p*) and metal post 104 can be further improved.

An opposite side of the surface of the conductor pad (102*p*) illustrated in FIG. 2 connecting to the metal post 104 is connected to a via conductor 112. This structure may be preferable from a point of view of suppressing peeling between the conductor pad (102*p*) and the resin insulating layer 101. A stress applied to the conductor pad (102*p*) due to an external force applied to the metal post 104, such as when an electronic component is mounted, is dispersed by the via conductor 112, and stress concentration at an interface between the conductor pad (102*p*) and the resin insulating layer 101 can be suppressed. However, a conductor pad (102*p*) does not necessarily have to be connected to a via conductor 112.

Figure 3:
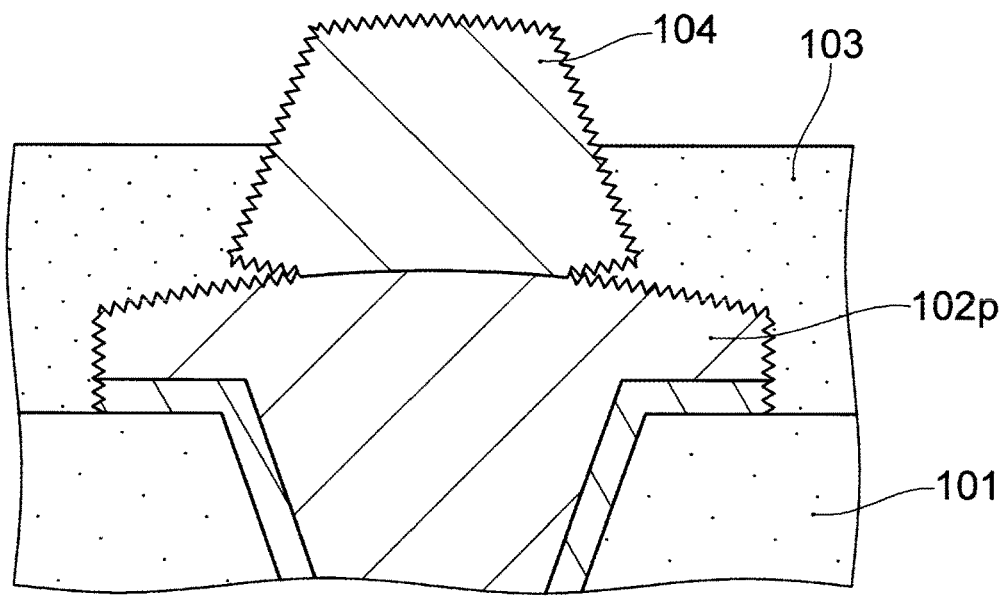
FIG. 3 is a cross-sectional view illustrating a different example of the wiring substrate illustrated in FIG. 2.

FIG. 3 illustrates a partial enlarged view of the wiring substrate 10 having a metal post 104 different in shape from the metal post 104 illustrated in FIG. 2. A surface on an upper end side of the metal post 104 illustrated in FIG. 3 bulges corresponding to the bulging shape of the conductor pad (102*p*). When the upper end surface of the metal post 104 has such a bulging shape, connection reliability between the metal post 104 and a connection pad of an electronic component or the like may be improved. Bondability with a connecting member such as a solder interposed between the metal post 104 and a connecting pad of an electronic component or the like can be improved. Such a bulging shape of the metal post 104 can be formed by adjusting the bulging shape of the conductor pad (102*p*) and a condition or the like of electrolytic plating performed on the conductor pad (102*p*).

From a point of view of the bondability between the metal post 104 and a connecting member such as a solder and the adhesion between the coating insulating layer 103 and the metal post 104 and the conductor pad (102*p*) as described above, it is desirable that the surfaces of the metal post 104 and the conductor pad (102*p*) are formed as rough surfaces as illustrated in FIG. 3. For example, the surfaces of the metal post 104 and the conductor pad (102*p*) are subjected to a common surface roughening treatment, and the surfaces of the metal post 104 and the conductor pad (102*p*) can be formed as rough surfaces having substantially the same surface roughness. The adhesion between the coating insulating layer 103 and the metal post 104 and the conductor pad (102*p*) can be improved.

In the following, a method for manufacturing the wiring substrate 10 illustrated in FIG. 1 is described with reference to FIGS. 4A-4G. In FIGS. 4A-4G, similar to FIG. 1, the wiring substrate 10 is not entirely illustrated, and only a partial cross section of the component mounting surface (F) side where the metal posts 104 are formed is illustrated. Also in the following description, in each element, a side) on the component mounting surface (F) side of the wiring substrate 10 (an upper side in a drawing sheet) is referred to as "upper" or an "upper side," and is also referred to as an "outer side" or simply "outer."

Figure 4A:
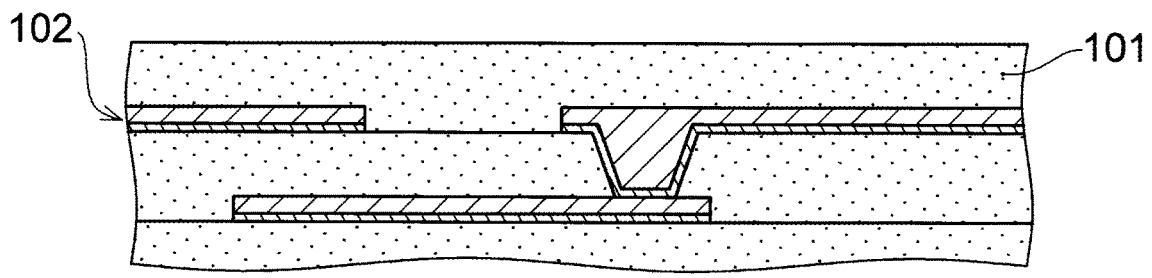
FIG. 4A is a cross-sectional view illustrating a method for manufacturing a wiring substrate according to an embodiment of the present invention.

First, as illustrated in FIG. 4A, a wiring substrate (10*p*) in which processing up to the lamination of the outermost resin insulating layer 101 has been completed is prepared. The wiring substrate (10*p*) may be manufactured using a general method for manufacturing a wiring substrate using a build-up method in which multiple insulating layers and multiple conductor layers are laminated.

Figure 4B:
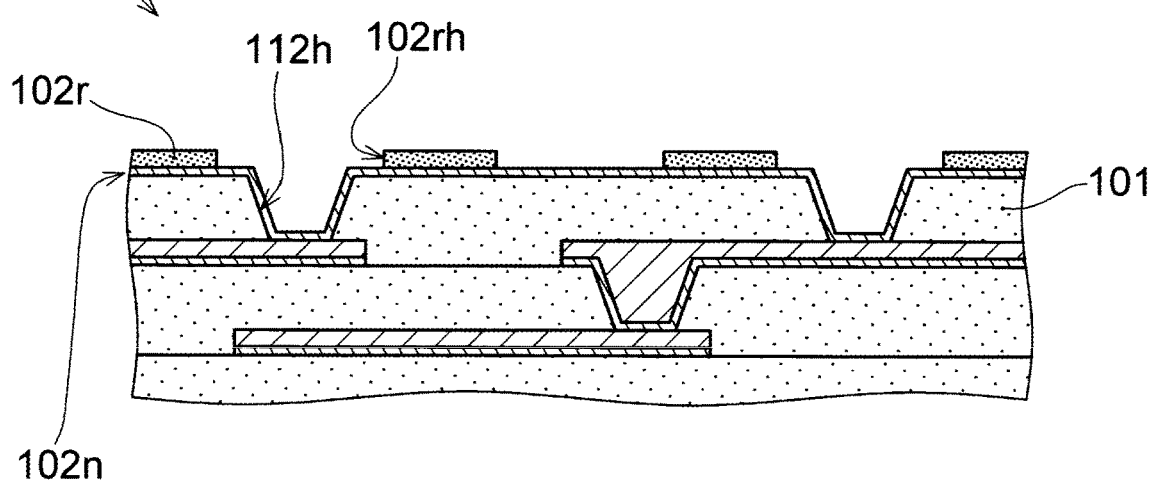
FIG. 4B is a cross-sectional view illustrating the method for manufacturing a wiring substrate according to the embodiment of the present invention.

Next, as illustrated in FIG. 4B, the conduction holes (112*h*) penetrating the outermost resin insulating layer 101 are formed at positions corresponding to formation locations of the via conductors 112 in the resin insulating layer 101 of the wiring substrate (10*p*). The conduction holes (112*h*) are drilled by irradiation of laser such as CO2 laser or YAG laser. Then, the metal film layer (102*n*), which is, for example, an electroless copper plating film layer, is formed by electroless plating on inner sides of the conduction holes (112*h*) and over the entire surface of the resin insulating layer 101.

Subsequently, a plating resist (102*r*) for electrolytic plating is formed on the metal film layer (102*n*). The plating resist (102*r*) is formed using, for example, a dry film resist containing an acrylic resin or the like. The plating resist (102*r*) is formed to have openings (102*rh*) according to a conductor pattern including the conductor pads (102*p*) to be included in the outermost conductor layer 102 of the wiring substrate 10. The openings (102*rh*) can be formed using photolithography by exposure and development using a mask having a suitable opening pattern.

Figure 4C:
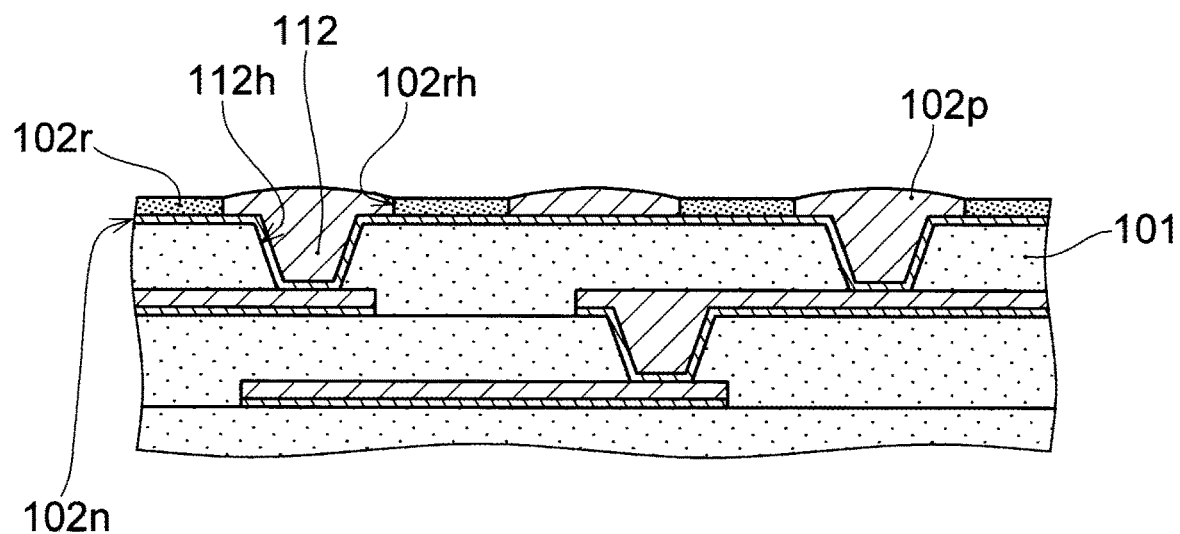
FIG. 4C is a cross-sectional view illustrating the method for manufacturing a wiring substrate according to the embodiment of the present invention.

Next, as illustrated in FIG. 4C, the conduction holes (112*h*) of the outermost resin insulating layer 101 and the openings (102rh) of the plating resist (102r) are filled by electrolytic plating using the metal film layer (102n) as a seed layer. The via conductors 112 and the conductor pads (102p) are formed. By appropriately adjusting conditions (such as temperature, current density, and plating time) of the electrolytic plating in which the metal film layer (102n) is used as a seed layer, the conductor pads (102p) that bulge upward can be obtained. After the formation of the conductor pads (102p), the plating resist (102r) is removed.

Figure 4D:
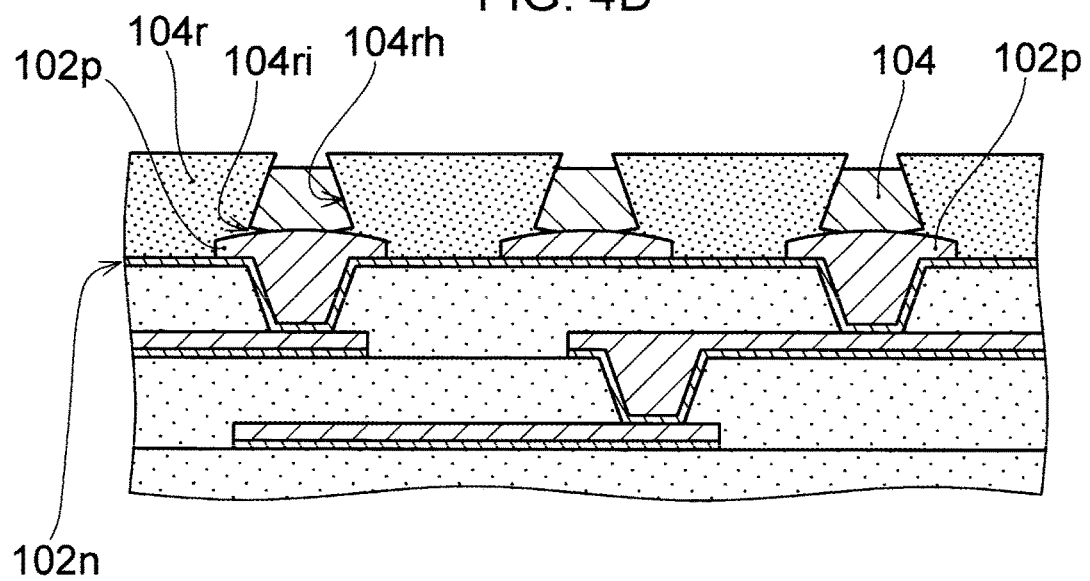
FIG. 4D is a cross-sectional view illustrating the method for manufacturing a wiring substrate according to the embodiment of the present invention.

Next, as illustrated in FIG. 4D, a resist layer (104r) for forming the metal posts 104 is formed on the metal film layer (102n) exposed by the removal of the plating resist (102r), and on the conductor pads (102p). The resist layer (104r) is formed using, for example, a photosensitive dry film resist containing an acrylic resin or the like. Openings (104rh) for forming the metal posts 104 are formed in the resist layer (104r). Photolithography is used for the formation of the openings (104rh). By appropriately adjusting light transparency of a resin material used for the resist layer (104r), an opening shape of a photomask used in the photolithography, an exposure condition, and the like, a wedge-shaped portion (104ri) is formed in the resist layer (104r). This wedge-shaped portion (104ri) defines the shape of the interposed part (103i) at a stage when the wiring substrate 10 is completed.

Subsequently, the metal posts 104 are formed by performing electrolytic plating using the metal film layer (102n) as a power feeding layer on inner surfaces of the openings (104rh) of the resist layer (104r). The electrolytic plating used for the formation of the metal posts 104 is, for example, electrolytic copper plating or electrolytic nickel plating. A plating layer formed by the electrolytic plating grows in a so-called bottom-up manner upward from the surfaces of the conductor pads (102p), which are bottom surfaces of the openings (104rh).

The electrolytic plating is terminated in a state in which the openings (104rh) are filled to a desired position, and the formation of the metal posts 104 is completed. The shape of the upper surface (upper end surface) of each metal post 104 can change depending on the shape of the surface of the conductor pad (102p) in contact with the metal post 104, a condition of the electrolytic plating, and the like. By appropriately adjusting these, the metal posts 104 each having a bulging upper end surface can also be formed. A surface protective film (not illustrated in the drawings) formed of Ni/Sn, Au, Ni/Au, Ni/Pd/Au, or the like can be formed on the upper end surface of each of the metal posts 104.

Figure 4E:
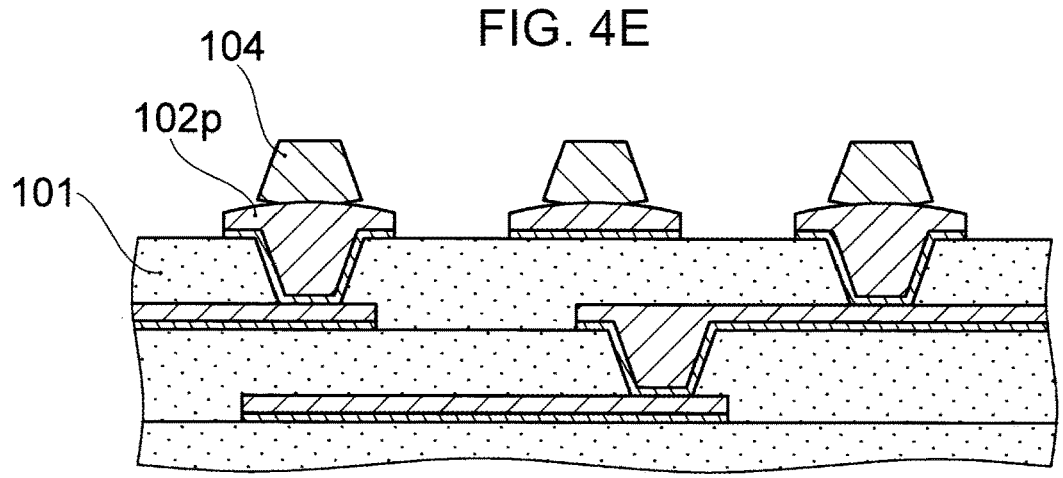
FIG. 4E is a cross-sectional view illustrating the method for manufacturing a wiring substrate according to the embodiment of the present invention.

Next, as illustrated in FIG. 4E, the resist layer (104r) is removed. The metal film layer (102n) exposed by the removal of the resist layer (104r) is removed by etching. The conductor pads (102p) and the metal posts 104 are completely exposed, and the surface of the resin insulating layer 101 is exposed between the multiple conductor pads (102p). By the removal of the resist layer (104r), the wedge-shaped portion (104ri) is also removed, and a gap having the same shape as the portion (104ri) is formed on a peripheral edge of a connecting portion between the metal posts 104 and the conductor pads (102p). In order to improve adhesion with the coating insulating layer 103 that covers the metal posts 104 and the conductor pads (102p) in a subsequent process, the exposed surfaces of the metal posts 104 and the conductor pads (102p) may be subjected to a surface roughening treatment.

Figure 4F:
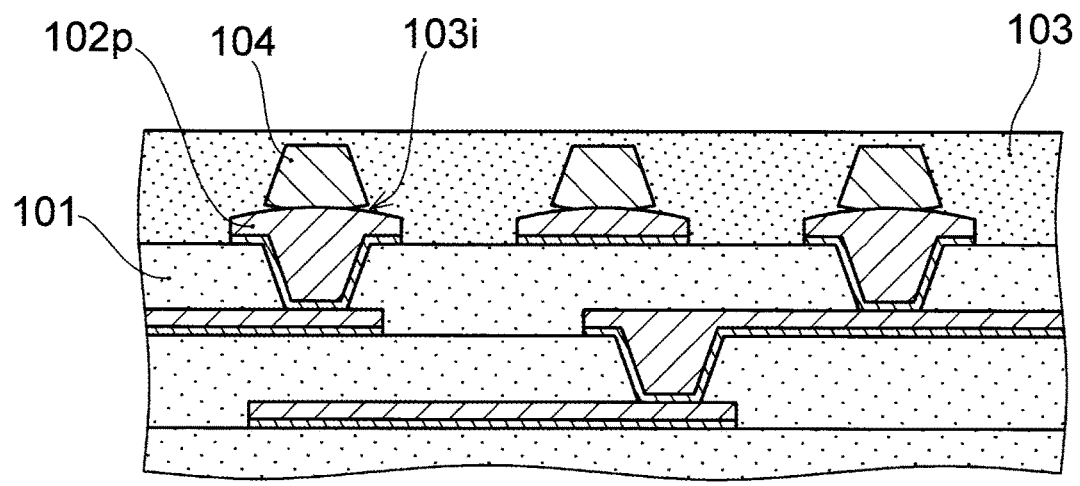
FIG. 4F is a cross-sectional view illustrating the method for manufacturing a wiring substrate according to the embodiment of the present invention.

Next, as illustrated in FIG. 4F, the coating insulating layer 103 is formed so as to cover the surface of the resin insulating layer 101 exposed between the multiple conductor pads (102p), and cover the conductor pads (102p) and the metal posts 104. The coating insulating layer 103 completely covers the conductor pads (102p) and the metal posts 104. As a result, the metal posts 104 are embedded in the coating insulating layer 103.

In the formation of the coating insulating layer 103, the resin material forming the coating insulating layer 103 enters the above-described gap that has the same shape as the portion (104ri), and the interposed part (103i) interposing between the metal posts 104 and the conductor pads (102p) is formed.

Figure 4G:
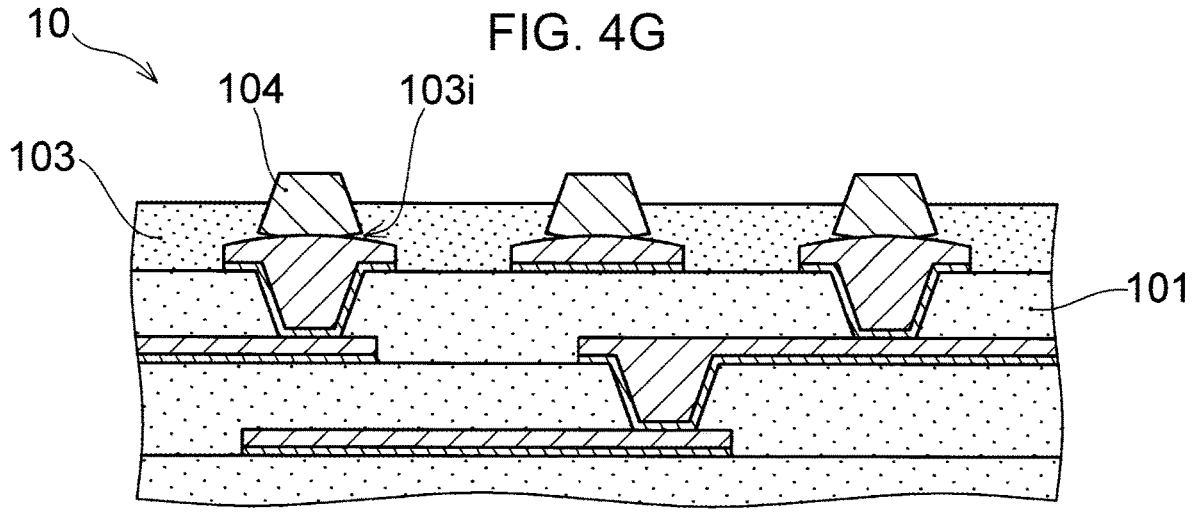
FIG. 4G is a cross-sectional view illustrating the method for manufacturing a wiring substrate according to the embodiment of the present invention.

Next, as illustrated in FIG. 4G, a portion of the coating insulating layer 103 in the thickness direction is removed, and a portion of each of the metal posts 104 is exposed from the coating insulating layer 103. The metal posts 104 are in a state of protruding upward from the coating insulating layer 103. For the partial removal of the coating insulating layer 103 in the thickness direction, for example, a dry process such as plasma etching using $CF_4$ or $CF_4+O_2$ can be used. Further, it is also possible that the coating insulating layer 103 is partially removed in the thickness direction by a blast treatment to expose the metal posts 104. Through the above processes, the wiring substrate 10 illustrated in FIG. 1 is completed. A surface protective film (not illustrated in the drawings) formed of heat-resistant preflux or the like may be formed on portions of the metal posts 104 exposed from the coating insulating layer 103.

In the manufacture of the wiring substrate 10 of the embodiment, after the removal of the plating resist (102r) following the formation of the conductor pads (102p) illustrated in FIG. 4C, the wiring substrate 10 may be manufactured through processes different from the above-described processes. When the wiring substrate 10 is manufactured through different processes, the resist layer (104r) is not formed on the metal film layer (102n), and, following the removal of the plating resist (102r), the metal film layer (102n) exposed between the conductor pads (102p) is also removed. The coating insulating layer 103 is formed on the surface of the resin insulating layer 101 exposed by the removal of the metal film layer (102n), and on the conductor pads (102p).

For example, the coating insulating layer 103 as a solder resist covers the surface of the resin insulating layer 101 and covers the conductor pads (102p). Similar to the case where the resist layer (104r) is covered and the metal posts 104 are formed in the openings (104rh) of the resist layer (104r), openings exposing the conductor layer 102 are formed in the coating insulating layer 103 by exposure and development. By the exposure and development, the interposed part (103i) is formed.

Next, the metal posts 104 are formed by electroless plating in the openings formed in the coating insulating layer 103. In this case, in the formation of the metal posts 104, a catalyst layer for plating deposition can be formed in the openings prior to electroless plating. For the catalyst layer, for example, a metal such as palladium (Pd), gold (Au), platinum (Pt), or ruthenium (Ru) can be used. Depending on an application state of the catalyst layer, an electroless plating layer is formed only in the openings, and the metal posts 104 are formed. Following the formation of the metal posts 104, a portion of the coating insulating layer 103 in the thickness direction is removed. The metal posts 104 are partially exposed from the coating insulating layer 103 and protrude upward. The formation of the wiring substrate 10 is completed.

The wiring substrate of the embodiment is not limited to a wiring substrate having the structures exemplified in the drawings, or the structures or materials exemplified in the present specification. For example, the conductor layer 102 closest to the component mounting surface (F) may include different conductor patterns in addition to the conductor pads (102*p*). Further, the method for manufacturing the wiring substrate of the embodiment is not limited to the method described with reference to the drawings, and conditions, processing order, and the like of the method can be modified as appropriate.

Depending on a structure of an actually manufactured wiring substrate, some of the processes may be omitted, or other processes may be added.

In the wiring substrate of Japanese Patent Application Laid-Open Publication No. 2016-18806, a region where the solder resist layer (coating insulating layer) is in contact with the metal post and the wiring layer (conductor pad) is relatively small, and it is thought that adhesion of the solder resist layer with the metal post and the wiring layer cannot be satisfactorily ensured. It is thought that peeling of the solder resist layer from the metal post and the wiring layer may occur depending on an external force applied to the metal post or the like.

A wiring substrate according to an embodiment of the present invention includes: a resin insulating layer; a conductor pad that is formed on the resin insulating layer; a coating insulating layer that covers the resin insulating layer and the conductor pad; and a metal post that is connected to the conductor pad and protrudes from the coating insulating layer. At a peripheral edge of a portion where the metal post and the conductor pad connect to each other, an interposed part is formed in which the coating insulating layer is interposed between the metal post and the conductor pad.

According to an embodiment of the present invention, a highly reliable wiring substrate can be provided in which a coating insulating layer has a good adhesion with a metal post and a conductor pad and occurrence of a defect such as peeling is suppressed.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring substrate, comprising:
   a resin insulating layer;
   a conductor pad formed on the resin insulating layer and having a bulging surface;
   a coating insulating layer formed on the resin insulating layer such that the coating insulating layer is covering the conductor pad; and
   a metal post having a lowermost surface and protruding from the coating insulating layer such that the lowermost surface of the metal post is positioned on the bulging surface of the conductor pad and that a gap is formed between the lowermost surface of the metal post and the bulging surface of the conductor pad at a peripheral edge of the metal post,
   wherein the coating insulating layer is formed such that the coating insulating layer has an interposed portion formed in the gap between the metal post and the conductor pad at the peripheral edge of the metal post and that the interposed portion curves at the interface of the interposed portion and the bulging surface of the conductor pad, and the conductor pad is formed such that the bulging surface of the conductor pad is a convex surface curving from a periphery of the conductor pad to an apex at a center portion of the conductor pad and being convex toward the lowermost surface of the metal post.

2. The wiring substrate according to claim 1, further comprising:
   a via conductor formed in the resin insulating layer such that the via conductor is penetrating through the resin insulating layer and connected to the conductor pad on an opposite side with respect to the metal post.

3. The wiring substrate according to claim 2, wherein the conductor pad and the metal post comprise a same metal material.

4. The wiring substrate according to claim 3, wherein the metal post is formed such that the lowermost surface of the metal post is connected to an apex of the bulging surface of the conductor pad.

5. The wiring substrate according to claim 2, wherein the gap between the lowermost surface of the metal post and the bulging surface of the conductor pad is formed such that the interposed portion of the coating insulating layer has a shape that is reduced in width from the peripheral edge toward a center of the metal post.

6. The wiring substrate according to claim 2, wherein the metal post is formed such that the metal post has a roughened surface portion covered by the coating insulating layer.

7. The wiring substrate according to claim 6, wherein the conductor pad has a roughened surface portion covered by the coating insulating layer and formed such that the roughened surface portion of the metal post and the roughened surface portion of the conductor pad have substantially a same surface roughness.

8. The wiring substrate according to claim 1, wherein the conductor pad and the metal post comprise a same metal material.

9. The wiring substrate according to claim 8, wherein the metal post is formed such that the metal post has a roughened surface portion covered by the coating insulating layer.

10. The wiring substrate according to claim 9, wherein the conductor pad has a roughened surface portion covered by the coating insulating layer and formed such that the roughened surface portion of the metal post and the roughened surface portion of the conductor pad have substantially a same surface roughness.

11. The wiring substrate according to claim 8, wherein the gap between the lowermost surface of the metal post and the bulging surface of the conductor pad is formed such that the interposed portion of the coating insulating layer has a shape that is reduced in width from the peripheral edge toward a center of the metal post.

12. The wiring substrate according to claim 1, wherein the metal post is formed such that the lowermost surface of the metal post is connected to an apex of the bulging surface of the conductor pad.

13. The wiring substrate according to claim 12, further comprising:
    a via conductor formed in the resin insulating layer such that the via conductor is penetrating through the resin insulating layer and connected to the conductor pad on an opposite side with respect to the metal post.

14. The wiring substrate according to claim 13, wherein the metal post is formed such that the lowermost surface of the metal post is connected to an apex of the bulging surface of the conductor pad.

15. The wiring substrate according to claim 12, wherein the conductor pad and the metal post comprise a same metal material.

16. The wiring substrate according to claim 12, wherein the gap between the lowermost surface of the metal post and the bulging surface of the conductor pad is formed such that the interposed portion of the coating insulating layer has a shape that is reduced in width from the peripheral edge toward a center of the metal post.

17. The wiring substrate according to claim 12, wherein the metal post is formed such that the metal post has a roughened surface portion covered by the coating insulating layer.

18. The wiring substrate according to claim 1, wherein the gap between the lowermost surface of the metal post and the bulging surface of the conductor pad is formed such that the interposed portion of the coating insulating layer has a shape that is reduced in width from the peripheral edge toward a center of the metal post.

19. The wiring substrate according to claim 1, wherein the metal post is formed such that the metal post has a roughened surface portion covered by the coating insulating layer.

20. The wiring substrate according to claim 19, wherein the conductor pad has a roughened surface portion covered by the coating insulating layer and formed such that the roughened surface portion of the metal post and the roughened surface portion of the conductor pad have substantially a same surface roughness.

* * * * *